United States Patent [19]
Overweg

[11] Patent Number: 5,185,575
[45] Date of Patent: Feb. 9, 1993

[54] MAGNETIC RESONANCE IMAGING APPARATUS WITH ARTEFACT REDUCTION

[75] Inventor: Johannes A. Overweg, Eindhoven, Netherlands

[73] Assignee: U.S. Philips Corp., New York, N.Y.

[21] Appl. No.: 624,716

[22] Filed: Dec. 4, 1990

[30] Foreign Application Priority Data

Dec. 14, 1989 [NL] Netherlands ............... 8903066

[51] Int. Cl.⁵ .................................... G01R 33/20
[52] U.S. Cl. ........................................... 324/309
[58] Field of Search .......... 324/300, 307, 309, 310, 324/311, 312, 313, 314, 318, 322

[56] References Cited

U.S. PATENT DOCUMENTS

| | | | |
|---|---|---|---|
| 4,431,968 | 2/1984 | Edelstein et al. | 324/309 |
| 4,591,789 | 5/1986 | Glover et al. | 324/307 |
| 4,638,253 | 1/1987 | Jaskolski et al. | 324/311 |
| 4,737,718 | 4/1988 | Kemner et al. | 324/322 |
| 5,122,747 | 6/1992 | Riederer et al. | 324/309 |

Primary Examiner—Michael J. Tokar
Attorney, Agent, or Firm—Jack D. Slobod

[57] ABSTRACT

A high order multipole gradient field generating system in a magnetic resonant imaging apparatus comprises spaced quadrants of windings, the windings of each quadrant generating adjacent fields in each quadrant in opposing relation. The multipole system is located adjacent to a lower order conventional gradient field coil system to shield the region of interest from field aberrations, the multipole system generating a relatively strong local magnetic field adjacent to the coils of the gradient field coil system and a negligible change in field in the region of interest. The multipole system causes a frequency shift of the aberrations in the region of interest which are outside the detection frequency range such that the conventional gradient field system signal is substantially unaffected by the multipole system in the region of interest.

29 Claims, 2 Drawing Sheets

MAGNETIC RESONANCE IMAGING APPARATUS WITH ARTEFACT REDUCTION

BACKGROUND OF THE INVENTION

The invention relates to a magnetic resonance imaging apparatus for generating and detecting magnetic resonance signals, comprising a magnet for generating a steady magnetic field, a gradient coil system for generating gradient fields, and means for correcting image artefacts caused by local field aberrations.

A magnetic re imaging apparatus of this kind is known from U.S. Pat. No. 4,591,789. In an apparatus disclosed therein, field aberrations are measured and on the basis thereof a location determined by the local field, to be referred to hereinafter as field location, of an object point is shifted to a geometrically appropriate location. Correction can thus be made for strictly geometrical, monotonous aberrations of gradient fields within an examination space. For inhomogeneities of field gradients, for example homogeneities such that unintentially the same field strength occurs in several geometrical locations, correction is not possible in this way. This is because several regions of an object are then imaged in a single image region due to equal field strengths at points in different regions. Image defects, also referred to as artefacts, also occur, for example because resonance signals from sub-regions of an object which are situated outside a volume to be examined unduly contribute to the imaging due to their same field location as object regions situated within the volume to be examined. The latter phenomenon will occur notably in apparatus comprising a magnet system having a comparatively small transverse dimension with respect to an object to be examined, so that the distance between peripheral object regions and current windings of the coil system are comparatively small. Similar errors may occur due to field strength aberrations in the main magnetic field near axial ends of the magnet. A gradient field applied at that area can, for example be locally compensated, so that the position determination is lost. These artefacts will occur notably in magnet systems having a comparatively small axial dimension.

The occurrence of a part of the artefacts can be prevented by providing a magnetic resonance imaging apparatus with a magnet system having a large transverse dimension and a long length with respect to objects to be measured, for example patients to be examined. Notably a larger diameter is extremely unattractive because of the power required; when a superconducting main magnet is used, notably the power for applying gradient fields is important. A longer magnet makes the apparatus expensive and patient-unfriendly.

SUMMARY OF THE INVENTION

It is an object of the invention to mitigate the described drawbacks; to achieve this, a magnetic resonance imaging apparatus of the kind set forth in accordance with the invention is characterized in that the magnet system includes a higher-order multipole system for generating a magnetic field which is comparatively strong near current conductors of the magnet system and which is only negligibly weak at a larger distance therefrom, measured in the radial direction.

Because comparatively strong fields can be locally generated by means of a multipole system in a magnetic resonance imaging apparatus in accordance with the invention, the frequency of resonance signals collected at that area is liable to be raised beyond a frequency range to be measured.

In a preferred embodiment, the multipole system comprises current conductors which extend along substantially circular paths in a circular cylindrical magnet system. The spacing of the current conductors is adapted to a desirable influencing field strength. Current conductors of the multipole system are wound in opposite directions in an alternating fashion. In a preferred embodiment, the current conductors are adapted to a substantially oval shape of patients and extend only through two diametrically situated arc angles of from, for example approximately 30° to 45°.

In a further embodiment, the multipole system is selectively activatable during excitation, so that no resonance signals are generated at the area of the interference fields. In the case of a spin-echo measuring technique, the multipole system is activatable during a preparation phase between the 90° and 180° rf pulses, the system not being activated after the subsequent 180° rf refocussing pulse. The selective activation may also be executed as an activation with different polarity and/or amplitude.

BRIEF DESCRIPTION OF THE DRAWING

Some preferred embodiments in accordance with the invention will be described in detail hereinafter with reference to the drawing. Therein.

DESCRIPTION OF THE PREFERRED EMBODIMENTS

Figure 1:
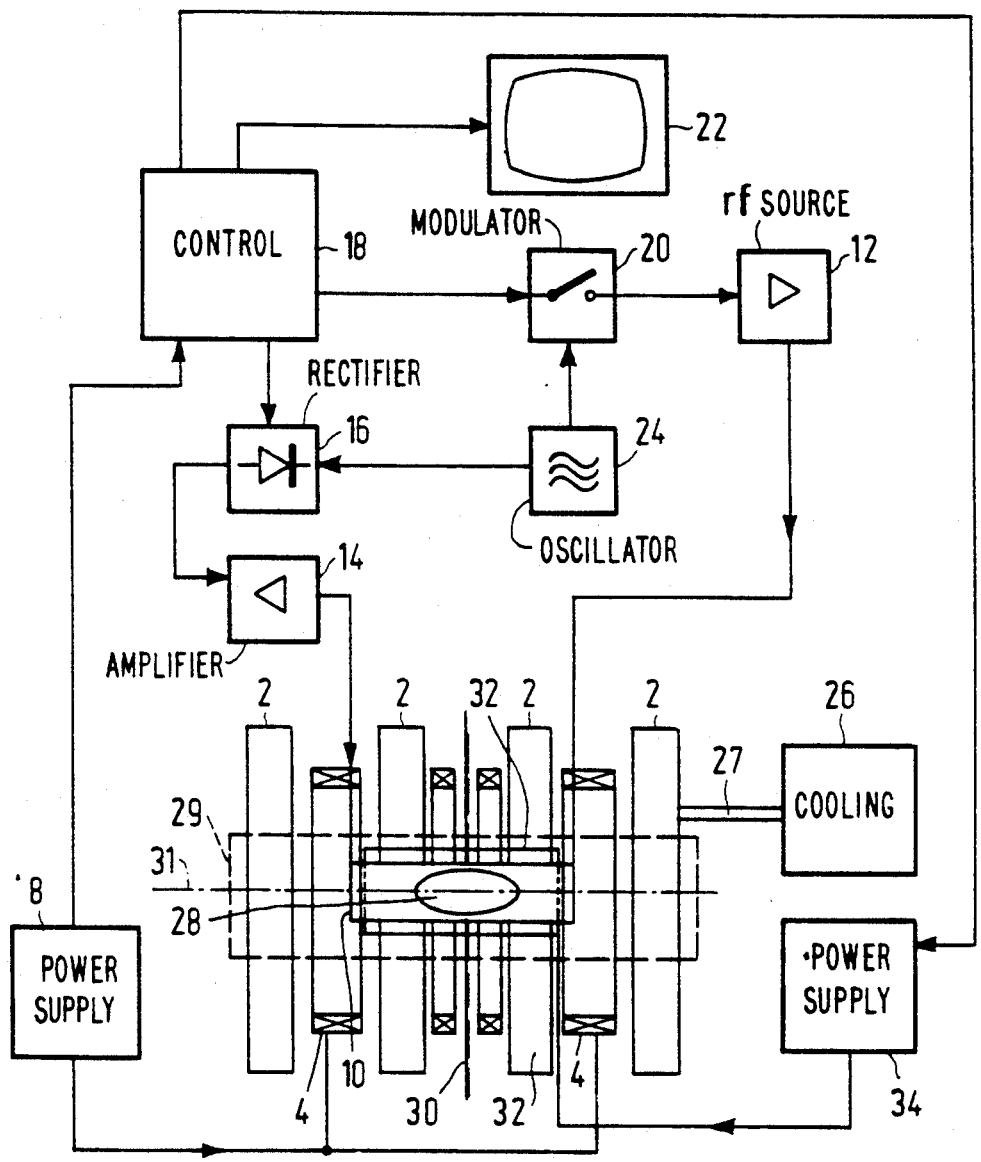
FIG. 1 shows a magnetic resonance imaging apparatus in accordance with the invention.

A magnetic resonance imaging apparatus as shown in FIG. 1 comprises a magnet system 2 for generating a steady magnetic field, a magnet system 4 for generating magnetic gradient fields, and a power supply source 8 for the magnet system 3. An rf magnet coil 10 serves to generate an rf electromagnetic alternating field, for example as described in U.S. Pat. No. 4,737,718, and is connected to an rf source 12. For the detection of magnetic resonance signals induced by the rf transmitted field in an object to be examined, herein use is also made of the coil 10 which is connected to a signal amplifier 14 for this purpose. For the detection use can alternatively be made of a separate rf coil system, for example a system comprising one or more surface coils. The signal amplifier 14 is connected to a phase-sensitive rectifier 16 which is connected to a central control device 18. The central control device 18 also controls a modulator 20 for the rf source 12, the power supply source 8 for the gradient coils and, for example a monitor 22 for image display. An rf oscillator 24 controls the modulator 20 as well as the phase-sensitive rectifier 16 which processes the measuring signals. For cooling, if any, there is provided a cooling device 26 which comprises cooling ducts 27. A cooling device of this kind may be constructed as a water cooling system for resistive coils or as a dewar system containing liquid helium and nitrogen or only nitrogen for cooled superconducting coils. The rf coil 10, being arranged within the magnet systems 2 and 4, encloses a measuring space 28 which, in the case of an apparatus for medical diagnostic measurements, offers sufficient space to accommodate a patient. A steady magnetic field, gradient fields for position selection of slices to be imaged, and a spatially uniform rf alternating field can thus be generated, in the measuring space 28.

A gradient magnet system 4 is symmetrically arranged with respect to a radial symmetry plane 30 in a conventional manner, the plane also dividing the measuring space symmetrically into two parts and being oriented through a point $Z=0$, transversely of a Z-axis 31 of the magnet system. The steady magnetic field generated by the steady magnet system is directed parallel to the Z-axis in the present case. A gradient magnet system in a magnetic resonance imaging apparatus customarily comprises a coil system for each of the coordinate directions, activation of the coil system producing a field directed parallel to the Z-axis which has a gradient in an associated coordinate direction of the coil system so that a pixel-wise image of an object can be formed.

A multipole system 32 in accordance with the invention is connected to a power supply source 34 which is controlled by the central control unit. For a symmetrical magnet system the multipole will usually also have a symmetrical construction. A multipole may then be assume to be composed of four quadrants.

Figure 2A:
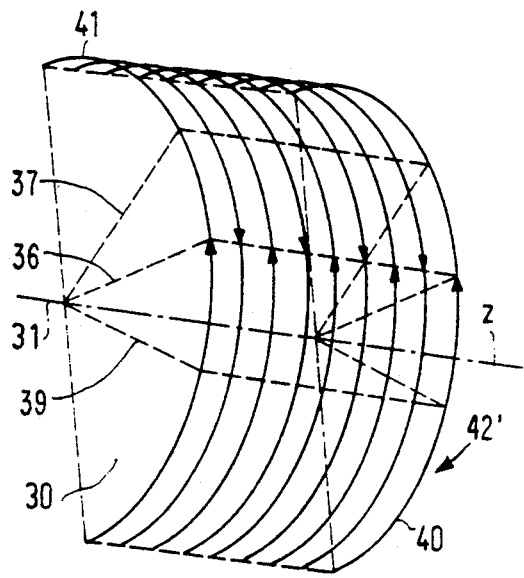
FIGS. 2a and 2b show appropriate multipole systems.
Figure 2B:
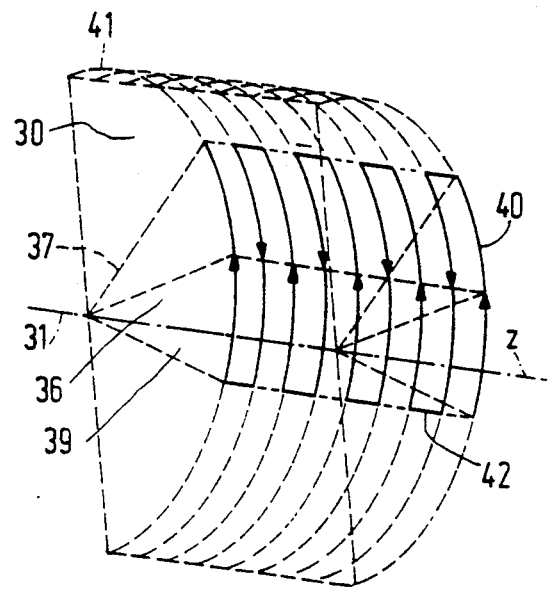

FIGS. 2a and 2b shows quadrants for multipole comprising current conductors 40 which extend along circular paths 41; in FIG. 2a the current conductors extend substantially through an arc angle of 180°, and in FIG. 2b the current conductors extend only through a smaller arc angle of, in this case, 30°. Using mutually axially extending connections 42, FIG. 2b shows how a system comprising windings of alternate polarity is simply realized. A multipole system as shown in FIG. 2a can be simply realized using a metal foil, notably a printed circuit board material which can be bent to the desired shape so as to be embedded in a coil former for the gradient coils. A plane 36 through an azimuthal center of the current conductors then extends parallel to a supporting surface of a patient table and planes 37 and 39 enclose an angle of, for example from approximately 30° to 45°.

Figure 3:
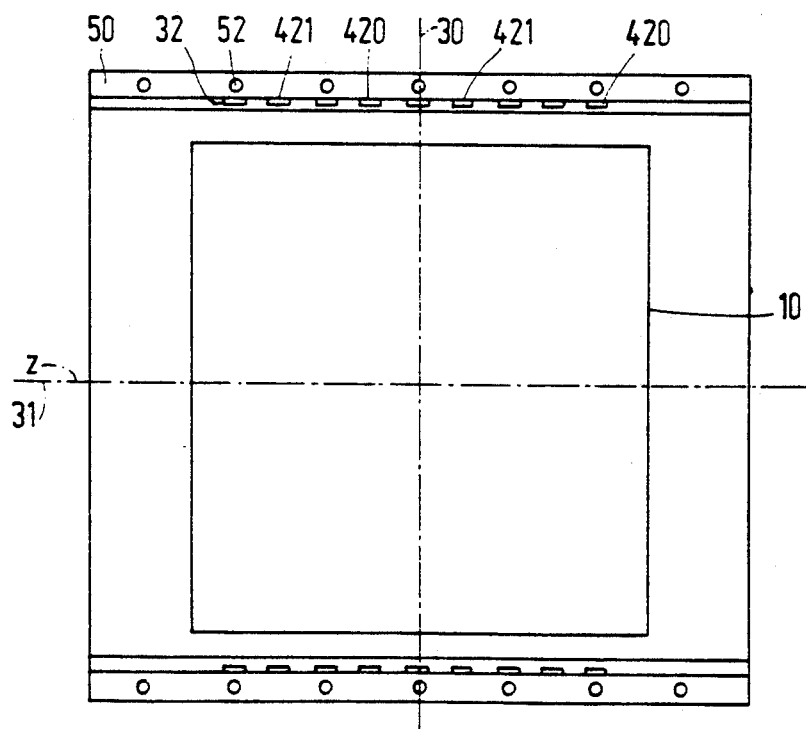
FIG. 3 diagrammatically shows an appropriate coil system.

FIG. 3 shows a multipole system embedded in a former 50 for a gradient coil system 52, in this case shown as round current turns accommodated in the former. Current windings 420 of a multipole system are shown, the windings being situated substantially opposite current turns of the gradient coil system. Between the windings 420 there are provided windings 421 which have been wound in the opposite direction and which serve to compensate fields generated by the windings 420 for larger distance from the wall of the former. The windings 420 and 421 together constitute the windings 42' and 42 as shown in respective FIGS. 2a and 2b.

System 32 is a higher-order multiple system for generating a magnetic field which is comparatively strong near the current conductors of the magnet system 4 and which is only negligibly weak at a larger distance therefrom, measured in the radial direction, by way of example, in the region of interest at measuring space 28. Comparatively strong fields are locally generated by multipole system 32. By locally generated it is meant that the strong fields are only adjacent to the conductors of the gradient coil system, for example, the coils of the multipole system and of the gradient coil system as shown in FIG. 3. Due to the fields generated by the multiple system, the frequencies of any resonance signals generated at that area are raised beyond the frequency range to be measured. As is known, the Larmor frequency at a point is proportional to the strength of the total magnetic field at that point. As the strength increases, the frequency also increases. The area outside the region of an object under examination tends to generate signals that may contribute in an unwanted way to the signals being detected from that region. The effect of an increased Larmor frequencies at points outside the region under examination produced by the multipole system, is such that these increased frequencies are not sensed by the detection system for the resonance signal which are to be measured because the increased frequencies are beyond the range of the detector system. The relatively strong locally generated magnetic fields produced by the multipole system 32 prevent signals from an area in the measuring space 28 external to the region under examination from interfering with the signals to be measured, i.e., the multipole system 32 provides an active shield for the examination region in space 28 relative to extraneous signals generated external to external to that region. Because the system 32 generates only local strong fields, these fields are not present in the region containing the signals to be measured and, therefore, have negligible effect on the signals being detected. The reason the fields are locally generated is because of the opposing relation of the adjacent windings of the coils of system 32.

The spacing of the current conductors 40 is adapted to a desirable field strength, i.e., the current conductors are situated at a distance from one another which is adapted to the field distributions of the gradient coils. The current conductors 40 of the multipole system 32 are wound in opposite directions in an alternating fashion so as to cancel the effect of their respective fields as distance from the conductors increases. In a preferred embodiment, the current conductors are adapted to a substantially oval shape of patients and extend through the diametrically situated 30 degrees of 45 degrees arc angles.

The multipole system 32 is selectively activatable by control 18 preferably in synchronism with and during rf pulse excitation, so as that no resonance signals are generated at the area near the current conductors 40 of multipole system 32. In the case of a spin-echo measuring technique, the multipole system 32 is activatable by control 18 during a preparation phase between the 90 degree and 180 degree rf pulses, the system not being activated after the subsequent 180 degree rf refocusing pulse. The selective activation may also be executed as an activation with different polarity and/or amplitude. For example, the control 18 is adapted for use with the spin-echo measuring technique and for activating the multipole system 32 exclusively during a 90 degree excitation pulse or exclusively during a subsequent 180 degree refocusing pulse. Also, the control 18 may activate the multipole system 32 with different current intensity and current directions via conductors.

I claim:

1. In a magnetic resonance imaging apparatus for generating and detecting magnetic resonance signals from a given region of interest within a measuring space, the combination comprising:

a magnet for generating a steady magnetic field, contribution to a total magnetic field in said measuring space;

gradient coil system of a given order including current conductors about the periphery of the measuring space for generating gradient magnetic fields contributions to said total magnetic field in said measuring space; and means for alleviating a generation of image artefacts caused by aberrations in the total magnetic field in said measuring space relatively near the current conductors of said gradient coil system, said means for alleviating including a multipole system of an order which is higher than said given order for generating a further magnetic field contribution to the total magnetic field in the measuring space which is comparatively strong relatively near the current conducts of said gradient coil system and comparatively weak relatively distant from said current conductors.

2. A magnetic resonance imaging apparatus as claimed in claim 11, wherein the multipole system comprises current conductors which extend along substantially circular paths in a circular cylindrical magnet system and having a spacing which is adapted to provide a given field strength.

3. A magnetic resonance imaging apparatus as claimed in claim 2, wherein current conductors of the multiple system are alternately wound in opposite directions.

4. A magnetic resonance imaging apparatus as claimed in claim 11 wherein the multipole system comprises current conductors, said current conductors of the multipole system extending through two diametrically situated arc angles of from approximately 30° to 45°.

5. A magnetic resonance imaging apparatus as claimed in claim 11 wherein the multipole system comprises current conductors, said current conductors of the multipole system being situated at a distance from one another which is adapted to have negligible effect on the field distributions of the gradient coil system.

6. A magnetic resonance imaging apparatus as claimed in claim 11 wherein the apparatus includes means for rf excitation and further including control means for activation of the multipole system in synchronism with said rf excitation.

7. A magnetic resonance imaging apparatus as claimed in claim 6 wherein the apparatus includes means for generating an rf excitation pulse, the control means activates the multipole system during said rf excitation pulse.

8. A magnetic resonance imaging apparatus as claimed in claim 7 wherein the control means is for spin-echo measuring and for activating the multiple system exclusively during a 90° excitation pulse or exclusively during a subsequent 180° refocussing pulse.

9. A magnetic resonance imaging apparatus as claimed in claim 6 wherein the control device activates the multiple system during a preparation phase between a 90° rf excitation pulse and a 180° rf excitation pulse, and does not activate the system after the 180° pulse.

10. A magnetic resonance imaging apparatus as claimed in claim 6 wherein the control means activates the multiple system with a different current intensity and current direction than in the gradient coil system.

11. A magnetic resonance imaging apparatus as claimed in claim 2 wherein the multipole system comprises current conductors, said current conductors of the multiple system extending through two diametrically situated arc angles of from approximately 30° to 45°.

12. A magnetic resonance imaging apparatus as claimed in claim 3 wherein the multipole system comprises current conductors, said current conductors of the multipole system extending through two diametrically situated arc angles of from approximately 30° to 45°.

13. A magnetic resonance imaging apparatus as claimed in claim 2 wherein the multiple system comprises current conductors, said current conductors of the multipole system being situated at a distance from one another which is adapted to have negligible effect on the field distributions of the gradient coil system.

14. A magnetic resonance imaging apparatus as claimed in claim 3 wherein the multipole system comprises current conductors, said current conductors of the multipole system being situated at a distance from one another which is adapted to have negligible effect on the field distributions of the gradient coil system.

15. A magnetic resonance imaging apparatus as claimed in claim 4 wherein the multipole system comprises current conductors, said current conductors of the multipole system being situated at a distance from one another which is adapted to have negligible effect on the field distributions of the gradient coil system.

16. A magnetic resonance imaging apparatus as claimed in claim 11 wherein the multiple system comprises current conductors, said current conductors of the multiple system being situated at a distance from one another which is adapted to have negligible effect on the field distributions of the gradient coil system.

17. A magnetic resonance imaging apparatus as claimed in claim 12 wherein the multipole system comprises current conductors, said current conductors of the multipole system being situated at a distance from one another which is adapted to have negligible effect on the field distributions of the gradient coil system.

18. A magnetic resonance imaging apparatus as claimed in claim 17 further including control means for activation of the multipole system in synchronism with said rf excitation.

19. A magnetic resonance imaging apparatus as claimed in claim 18 wherein the apparatus includes means for generating an rf excitation pulse, the control means activates the multipole system during said rf excitation pulse.

20. A magnetic resonance imaging apparatus as claimed in claim 19, wherein the control means is for spin-echo measuring and for activating the multipole system exclusively during a 90° excitation pulse or exclusively during a subsequent 180° refocussing pulse.

21. A magnetic resonance imaging apparatus as claimed in claim 18, wherein the control device activates the multipole system during a preparation phase between a 90° rf excitation pulse and a 180° rf excitation pulse, and does not activate the system after the 180° pulse.

22. A magnetic resonance imaging apparatus as claimed in claim 7 wherein the control means activates the multipole system with a different current intensity and current direction than in the gradient coil system.

23. A magnetic resonance imaging as claimed in claim 8 wherein the control means activates the multipole system with a direction current intensity and current direction than in the gradient coil system.

24. A magnetic resonance imaging apparatus as claimed in claim 9 wherein the control means activates the multipole system with a different current intensity and current direction than in the gradient coil system.

25. A magnetic resonance imaging apparatus as claimed in claim 21 wherein the control means activates the multipole system with a different current intensity and current direction than in the gradient coil system.

26. In a magnetic resonance imaging apparatus for generating and detecting magnetic resonance signals of a given nominal Larmor frequency in a measuring space of the apparatus, the combination comprising:
- a magnet for generating a steady magnetic field contribution to a total magnetic field in said measuring space;
- a gradient coil system of a given order including current conductors about the periphery of the measuring space for generating gradient fields contributions to a total magnetic field in said measuring space; and
- means for alleviating a generation of image artefacts caused by aberrations in the total magnetic field in said measuring space relatively near the current conductors of said gradient coil system including a multipole system of an order which is higher than said given order for generating a further magnetic field contribution to the total magnetic field in said measuring space which is comparatively strong relatively near the current conductors of said gradient coil system and comparatively weak relatively distant from said current conductors the further magnetic field contributions from said multipole system increasing the Larmor frequency at an area in said measuring space adjacent the periphery of the measuring space above said nominal Larmor frequency such that any magnetic resonance signals generated in said area are substantially undetected by said apparatus.

27. In a magnetic resonance imaging apparatus for generating and detecting magnetic resonance signals of a given frequency is a given examination region in a measuring space of the apparatus, image artefacts tending to be caused by aberrations in a total magnetic field at an area of said measuring space outside of said examination region, the combination comprising:
- a magnet for generating a steady magnetic field contribution to the total magnetic field in said measurement space;
- a gradient coil system of a given order for generating gradient magnetic fields contribution to the total magnetic field in said measuring space, said given order defining the relative change of intensity of the field for a given change of distance from said coil system; and
- a multipole system of an order which is higher than said given order shielding said given region from said area outside said region.

28. The combination of claim 27 wherein said gradient system generates a magnetic field of a given intensity, said multipole system for generating a field intensity sufficiently greater than said given intensity to effectively shield said region from said area while introducing negligible changes of field intensity at said region.

29. The combination of claim 28 wherein said multipole system generates a signal of a frequency sufficiently different than said given frequency so as to be substantially undetected by said apparatus in said region.

* * * * *